United States Patent
Weaver et al.

(10) Patent No.: US 10,393,363 B2
(45) Date of Patent: Aug. 27, 2019

(54) ILLUMINATION DEVICE FOR A FLUID DELIVERY APPARATUS

(71) Applicant: Delta Faucet Company, Indianapolis, IN (US)

(72) Inventors: Casey S. Weaver, Carmel, IN (US); Martin Jennings Kimbell, Wauconda, IL (US); Alisha Buescher, Jamestown, IN (US); Gerald R. Hayes, Lebanon, IN (US)

(73) Assignee: Delta Faucet Company, Indianapolis, IN (US)

( * ) Notice: Subject to any disclaimer, the term of this patent is extended or adjusted under 35 U.S.C. 154(b) by 0 days.

(21) Appl. No.: 15/958,674

(22) Filed: Apr. 20, 2018

(65) Prior Publication Data

US 2018/0306430 A1 Oct. 25, 2018

Related U.S. Application Data

(60) Provisional application No. 62/490,008, filed on Apr. 25, 2017.

(51) Int. Cl.
| | |
|---|---|
| *B05B 1/18* | (2006.01) |
| *E03C 1/02* | (2006.01) |
| *F21S 9/04* | (2006.01) |
| *F21V 7/00* | (2006.01) |
| *H05K 1/18* | (2006.01) |

(Continued)

(52) U.S. Cl.
CPC ............ *F21V 33/004* (2013.01); *B05B 1/185* (2013.01); *E03C 1/02* (2013.01); *F21S 9/046* (2013.01); *F21S 10/002* (2013.01); *F21V 7/0066* (2013.01); *F21V 23/0464* (2013.01); *F21V 23/0471* (2013.01); *F21S 10/00* (2013.01); *F21V 23/0442* (2013.01); *F21W 2131/30* (2013.01); *F21Y 2103/33* (2016.08); *F21Y 2115/10* (2016.08); *H05K 1/181* (2013.01);

(Continued)

(58) Field of Classification Search
CPC .. F21V 33/004; F21V 7/0066; F21V 23/0464; F21V 23/0471; F21V 23/0442; F21S 9/046; F21S 10/002; F21S 10/00; E03C 1/02; B05B 1/185; F21Y 2103/33; F21Y 2115/10; H05K 2201/10106; H05K 1/181; H05K 2201/10287; H05K 2201/10522; F21W 2131/30; A61L 2209/12
See application file for complete search history.

(56) References Cited

U.S. PATENT DOCUMENTS

| | | | |
|---|---|---|---|
| 2,036,567 A | 4/1936 | Cannon | |
| 2,105,632 A | 1/1938 | Bernesseer | |

(Continued)

FOREIGN PATENT DOCUMENTS

| | | |
|---|---|---|
| CA | 1135365 A | 11/1982 |
| CN | 2438270 Y | 7/2001 |

(Continued)

*Primary Examiner* — Joseph L Williams
*Assistant Examiner* — Jose M Diaz
(74) *Attorney, Agent, or Firm* — Faegre Baker Daniels LLP

(57) ABSTRACT

A sprayhead for dispensing water includes a housing and an illumination device supported by the housing. The illumination device includes a plurality of light emitters supported by a substrate, and a translucent light pipe defining a closed loop to diffuse light outwardly from the light emitters.

24 Claims, 11 Drawing Sheets

(51) Int. Cl.
  *F21S 10/00*  (2006.01)
  *F21V 23/04*  (2006.01)
  *F21V 33/00*  (2006.01)
  *F21W 131/30* (2006.01)
  *F21Y 103/33* (2016.01)
  *F21Y 115/10* (2016.01)

(52) U.S. Cl.
  CPC .............. *H05K 2201/10106* (2013.01); *H05K 2201/10287* (2013.01); *H05K 2201/10522* (2013.01)

(56) References Cited

U.S. PATENT DOCUMENTS

| | | |
|---|---|---|
| 2,274,893 A | 3/1942 | Freedman |
| 2,598,357 A | 5/1952 | Coleman |
| 2,631,393 A | 3/1953 | Hetherington |
| 3,334,745 A | 8/1967 | Burgess et al. |
| 3,810,250 A | 5/1974 | McGregor |
| 3,812,340 A | 5/1974 | Brandt |
| 3,998,240 A | 12/1976 | Liautaud |
| 4,037,624 A | 7/1977 | Turner et al. |
| 4,088,880 A | 5/1978 | Walsh |
| 4,186,761 A | 2/1980 | Guarnieri |
| 4,241,868 A | 12/1980 | Perkins |
| 4,268,893 A | 5/1981 | Harrigan |
| 4,305,117 A | 12/1981 | Evans |
| 4,353,056 A | 10/1982 | Tsikos |
| 4,549,250 A | 10/1985 | Spector |
| 4,564,889 A | 1/1986 | Bolson |
| 4,616,298 A | 10/1986 | Bolson |
| 4,623,451 A | 11/1986 | Oliver |
| 4,630,940 A | 12/1986 | Ostertag et al. |
| 4,667,987 A | 5/1987 | Knebel |
| 4,744,895 A | 5/1988 | Gales et al. |
| 4,749,126 A | 6/1988 | Kessener et al. |
| 4,762,611 A | 8/1988 | Schipper |
| 4,849,098 A | 7/1989 | Wilcock et al. |
| 4,854,498 A | 8/1989 | Stayton |
| 4,856,121 A | 8/1989 | Traylor |
| 4,885,081 A | 12/1989 | Oliver |
| 4,894,647 A | 1/1990 | Walden, Jr. et al. |
| 4,901,922 A | 2/1990 | Kessener et al. |
| 4,955,535 A | 9/1990 | Tsutsui et al. |
| 4,994,792 A | 2/1991 | Ziegler, Jr. |
| 4,998,673 A | 3/1991 | Pilolla |
| 5,003,648 A | 4/1991 | Anderson |
| 5,041,950 A | 8/1991 | Tyson |
| 5,095,941 A | 3/1992 | Betz |
| 5,160,197 A | 11/1992 | Klose |
| 5,165,777 A | 11/1992 | Kira |
| 5,184,642 A | 2/1993 | Powell |
| 5,195,819 A | 3/1993 | Chaut et al. |
| 5,220,488 A | 6/1993 | Denes |
| 5,224,509 A | 7/1993 | Tanaka et al. |
| 5,232,008 A | 8/1993 | Jeffress et al. |
| 5,263,209 A | 11/1993 | Pattee |
| 5,276,595 A | 1/1994 | Patrie |
| 5,276,600 A | 1/1994 | Takase et al. |
| 5,291,378 A | 3/1994 | Stone |
| 5,308,287 A | 5/1994 | Gunsing |
| 5,373,427 A | 12/1994 | McLean |
| 5,388,287 A | 2/1995 | Tischler et al. |
| 5,390,092 A | 2/1995 | Lin |
| 5,400,820 A | 3/1995 | Orth |
| 5,491,617 A | 2/1996 | Currie |
| 5,535,779 A | 7/1996 | Huang |
| 5,566,702 A | 10/1996 | Philipp |
| 5,669,417 A | 9/1997 | Lian-Jie |
| 5,683,168 A | 11/1997 | Teig et al. |
| 5,699,833 A | 12/1997 | Tsataros |
| 5,758,688 A | 6/1998 | Hamanaka et al. |
| 5,793,130 A | 8/1998 | Anderson |
| 5,795,053 A | 8/1998 | Pierce |
| 5,858,215 A | 1/1999 | Burchard et al. |
| 5,868,311 A | 2/1999 | Cretu-Petra |
| 5,873,387 A | 2/1999 | Weber et al. |
| 5,873,647 A | 2/1999 | Kurtz et al. |
| 5,890,794 A | 4/1999 | Abtahi et al. |
| 5,891,329 A | 4/1999 | Massholder |
| 5,942,733 A | 8/1999 | Allen et al. |
| 6,003,160 A | 12/1999 | Seidle et al. |
| 6,014,985 A | 1/2000 | Warshawsky |
| 6,021,960 A | 2/2000 | Kehat |
| 6,036,333 A | 3/2000 | Spiller |
| 6,076,741 A | 6/2000 | Dandrel et al. |
| 6,082,407 A | 7/2000 | Paterson et al. |
| 6,126,290 A | 10/2000 | Veigel |
| 6,135,146 A | 10/2000 | Koganezawa et al. |
| 6,202,980 B1 | 3/2001 | Vincent et al. |
| 6,209,153 B1 | 4/2001 | Segien, Jr. |
| 6,231,203 B1 | 5/2001 | Olshausen |
| 6,294,786 B1 | 9/2001 | Marcichow et al. |
| 6,370,712 B1 | 4/2002 | Burns et al. |
| 6,370,965 B1 | 4/2002 | Knapp |
| 6,382,030 B1 | 5/2002 | Kihara et al. |
| 6,385,794 B1 | 5/2002 | Miedzius et al. |
| 6,385,798 B1 | 5/2002 | Burns et al. |
| 6,416,197 B1 | 7/2002 | Chang |
| 6,434,765 B1 | 8/2002 | Burns et al. |
| 6,439,472 B1 | 8/2002 | Lin et al. |
| 6,452,514 B1 | 9/2002 | Philipp |
| 6,478,440 B1 | 11/2002 | Jaworski et al. |
| 6,513,787 B1 | 2/2003 | Jeromson et al. |
| 6,519,790 B2 | 2/2003 | Ko |
| 6,548,192 B2 | 4/2003 | Chen |
| 6,548,193 B2 | 4/2003 | Chen |
| 6,551,722 B2 | 4/2003 | Jonte et al. |
| 6,558,816 B2 | 5/2003 | Chen |
| 6,619,320 B2 | 9/2003 | Parsons |
| 6,637,676 B2 | 10/2003 | Zieger et al. |
| 6,659,124 B2 | 12/2003 | Burns et al. |
| 6,685,890 B1 | 2/2004 | Van Remmen |
| 6,702,451 B1 | 3/2004 | Daane |
| 6,716,345 B2 | 4/2004 | Snyder |
| 6,729,349 B2 | 5/2004 | Brandebusemeyer |
| 6,734,685 B2 | 5/2004 | Rudrich |
| 6,743,532 B1 | 6/2004 | Chen |
| 6,752,517 B2 | 6/2004 | Hildebrand et al. |
| 6,764,775 B2 | 7/2004 | Chen |
| 6,770,376 B2 | 8/2004 | Chen |
| 6,770,384 B2 | 8/2004 | Chen |
| 6,774,584 B2 | 8/2004 | Lys et al. |
| 6,792,629 B2 | 9/2004 | Nelson et al. |
| 6,803,133 B2 | 10/2004 | Chen |
| 6,805,458 B2 | 10/2004 | Schindler et al. |
| 6,874,527 B2 | 4/2005 | Meeder |
| 6,909,101 B2 | 6/2005 | Nishioka |
| 6,962,168 B2 | 11/2005 | McDaniel et al. |
| 7,008,073 B2 | 3/2006 | Stuhlmacher, II |
| 7,017,600 B2 | 3/2006 | Klein |
| 7,104,519 B2 | 9/2006 | O'Maley et al. |
| 7,150,293 B2 | 12/2006 | Jonte |
| 7,174,577 B2 | 2/2007 | Jost et al. |
| 7,175,158 B2 | 2/2007 | Thomas |
| 7,201,175 B2 | 4/2007 | DeBoer et al. |
| 7,228,874 B2 | 6/2007 | Bolderheij et al. |
| 7,258,781 B2 | 8/2007 | Warren et al. |
| 7,303,300 B2 | 12/2007 | Dowling et al. |
| 7,344,902 B2 | 3/2008 | Basin et al. |
| 7,377,661 B2 | 5/2008 | Douglass |
| 7,404,649 B2 | 7/2008 | Gosis et al. |
| 7,406,980 B2 | 8/2008 | Pinette |
| 7,415,991 B2 | 8/2008 | Meehan et al. |
| 7,434,960 B2 | 10/2008 | Stuhlmacher, II et al. |
| 7,467,874 B2 | 12/2008 | Gautschi et al. |
| 7,518,381 B2 | 4/2009 | Lamborghini et al. |
| 7,537,023 B2 | 5/2009 | Marty et al. |
| 7,628,512 B2 | 12/2009 | Netzel, Sr. et al. |
| 7,631,372 B2 | 12/2009 | Marty et al. |
| 7,633,055 B2 | 12/2009 | Nall et al. |
| 7,666,497 B2 | 2/2010 | Takatsuki et al. |
| 7,690,395 B2 | 4/2010 | Jonte et al. |
| 7,717,133 B2 | 5/2010 | Pinette et al. |

(56) References Cited

U.S. PATENT DOCUMENTS

| | | | |
|---|---|---|---|
| 7,721,761 B2 | 5/2010 | Thomas | |
| 7,743,788 B2 | 6/2010 | Schmitt et al. | |
| 7,748,409 B2 | 7/2010 | Pinette et al. | |
| 7,766,043 B2 | 8/2010 | Thomas et al. | |
| 7,793,677 B2 | 9/2010 | Pinette | |
| 7,806,141 B2 | 10/2010 | Marty et al. | |
| 7,819,137 B2 | 10/2010 | Nelson et al. | |
| 7,819,541 B2 | 10/2010 | Kunkel | |
| 7,850,323 B2 | 12/2010 | Keiper et al. | |
| 7,883,261 B2 | 2/2011 | Yu | |
| 7,896,025 B2 | 3/2011 | Hanson | |
| 8,127,782 B2 | 3/2012 | Jonte et al. | |
| 8,162,236 B2 | 4/2012 | Rodenbeck et al. | |
| 8,198,979 B2 | 6/2012 | Haag et al. | |
| 8,277,070 B1 | 10/2012 | Schwarz | |
| 9,057,184 B2 | 6/2015 | Meehan et al. | |
| 9,333,698 B2 | 5/2016 | DeVries et al. | |
| 2002/0150798 A1 | 10/2002 | Jonte et al. | |
| 2002/0171378 A1 | 11/2002 | Morgan et al. | |
| 2003/0147238 A1 | 8/2003 | Allen et al. | |
| 2003/0213062 A1 | 11/2003 | Honda et al. | |
| 2003/0223222 A1 | 12/2003 | Yu | |
| 2004/0032749 A1* | 2/2004 | Schindler | E03C 1/0412 |
| | | | 362/555 |
| 2004/0179351 A1 | 9/2004 | Patterson | |
| 2004/0258567 A1 | 12/2004 | Kokin et al. | |
| 2005/0257628 A1 | 11/2005 | Nikaido et al. | |
| 2005/0279676 A1 | 12/2005 | Izzy et al. | |
| 2006/0117476 A1* | 6/2006 | Kunkel | B05B 1/044 |
| | | | 4/675 |
| 2006/0124183 A1 | 6/2006 | Kuo | |
| 2006/0152917 A1* | 7/2006 | Stuhlmacher | E03C 1/04 |
| | | | 362/109 |
| 2006/0157127 A1 | 7/2006 | Bors et al. | |
| 2006/0157128 A1 | 7/2006 | Frackowiak et al. | |
| 2006/0175437 A1 | 8/2006 | Gross | |
| 2006/0283511 A1 | 12/2006 | Nelson | |
| 2007/0031624 A1 | 2/2007 | Brosius | |
| 2007/0069418 A1 | 3/2007 | Liao et al. | |
| 2007/0121326 A1 | 5/2007 | Nall et al. | |
| 2007/0137714 A1 | 6/2007 | Meehan et al. | |
| 2007/0241977 A1 | 10/2007 | Vance | |
| 2007/0273394 A1 | 11/2007 | Tanner et al. | |
| 2008/0099091 A1 | 5/2008 | Benstead | |
| 2008/0109956 A1 | 5/2008 | Bayley et al. | |
| 2008/0178935 A1 | 7/2008 | Thomas | |
| 2008/0178954 A1 | 7/2008 | Pinette et al. | |
| 2008/0185060 A1 | 8/2008 | Nelson | |
| 2008/0257706 A1 | 10/2008 | Haag | |
| 2008/0271238 A1* | 11/2008 | Reeder | A46B 7/04 |
| | | | 4/597 |
| 2008/0308165 A1 | 12/2008 | Meehan et al. | |
| 2009/0000026 A1 | 1/2009 | Hanson | |
| 2009/0039176 A1 | 2/2009 | Davidson et al. | |
| 2009/0161342 A1 | 6/2009 | Hou et al. | |
| 2009/0276954 A1 | 11/2009 | Davidson | |
| 2010/0093267 A1* | 4/2010 | Hogh | B60H 1/34 |
| | | | 454/76 |
| 2010/0117660 A1 | 5/2010 | Douglas et al. | |
| 2010/0125946 A1* | 5/2010 | Meisner | E03C 1/0404 |
| | | | 4/678 |
| 2010/0180375 A1 | 7/2010 | Meehan et al. | |
| 2010/0213398 A1* | 8/2010 | Brunner | E03C 1/0404 |
| | | | 251/129.01 |
| 2010/0242274 A1 | 9/2010 | Rosenfeld et al. | |
| 2011/0003144 A1 | 1/2011 | Brown et al. | |
| 2011/0012378 A1 | 1/2011 | Ueno et al. | |
| 2011/0016625 A1 | 1/2011 | Marty et al. | |
| 2011/0051877 A1 | 3/2011 | Ahlfeld et al. | |
| 2011/0187957 A1 | 8/2011 | Kim et al. | |
| 2011/0209781 A1 | 9/2011 | Fath | |
| 2011/0216526 A1 | 9/2011 | Li | |
| 2012/0188179 A1 | 7/2012 | Karlsson | |
| 2012/0200517 A1 | 8/2012 | Nikolovski | |
| 2012/0223805 A1 | 9/2012 | Haag et al. | |
| 2012/0227841 A1* | 9/2012 | Peteri | E03C 1/0411 |
| | | | 137/552 |
| 2013/0098489 A1 | 4/2013 | Meehan et al. | |
| 2013/0276911 A1* | 10/2013 | Meehan | E03C 1/04 |
| | | | 137/355.16 |
| 2013/0299608 A1 | 11/2013 | Spangler et al. | |
| 2014/0198491 A1 | 7/2014 | Schlueter | |
| 2014/0261767 A1 | 9/2014 | DeVries et al. | |
| 2015/0040997 A1 | 2/2015 | Blake et al. | |
| 2015/0202642 A1* | 7/2015 | Isley | B05B 9/01 |
| | | | 239/289 |
| 2015/0292693 A1 | 10/2015 | Franke | |
| 2016/0161086 A1 | 6/2016 | Kang | |
| 2016/0215860 A1 | 7/2016 | Thompson et al. | |
| 2016/0290532 A1 | 10/2016 | Defrance | |
| 2018/0128439 A1* | 5/2018 | Bruls | B05B 17/085 |
| 2018/0306429 A1* | 10/2018 | Rosko | F21V 33/004 |

FOREIGN PATENT DOCUMENTS

| | | |
|---|---|---|
| CN | 2488597 Y | 5/2002 |
| CN | 201250949 Y | 6/2009 |
| CN | 201354883 Y | 12/2009 |
| CN | 201407414 Y | 2/2010 |
| DE | 3135861 A1 | 3/1983 |
| DE | 3508680 A1 | 9/1986 |
| DE | 9109457 U1 | 10/1991 |
| DE | 4340933 A1 | 6/1995 |
| DE | 19638788 A1 | 3/1998 |
| DE | 19639802 A1 | 4/1998 |
| DE | 19822966 A1 | 12/1999 |
| DE | 10042722 A1 | 3/2002 |
| DE | 10128688 A1 | 3/2002 |
| DE | 10144602 A1 | 4/2003 |
| DE | 102013002236 A1 | 8/2014 |
| DE | 102013002236 A1 | 8/2014 |
| EP | 0679770 A2 | 11/1995 |
| EP | 0961067 A2 | 12/1999 |
| EP | 1022396 A2 | 7/2000 |
| GB | 2077470 A | 12/1981 |
| GB | 2281797 A | 3/1995 |
| GB | 2288974 A | 11/1995 |
| GB | 2288974 B | 9/1998 |
| GB | 2323696 A | 9/1998 |
| JP | H0893017 A | 4/1996 |
| JP | H10332490 A | 12/1998 |
| JP | 2001012646 A | 1/2001 |
| JP | 2001120448 A | 5/2001 |
| JP | 2001123485 A | 5/2001 |
| JP | 2001123486 A | 5/2001 |
| JP | 2001146774 A | 5/2001 |
| JP | 2001182109 A | 7/2001 |
| JP | 2001189106 A | 7/2001 |
| JP | 2001252647 A | 9/2001 |
| JP | 2001295344 A | 10/2001 |
| JP | 2001323531 A | 11/2001 |
| JP | 2002042546 A | 2/2002 |
| JP | 2002242245 A | 8/2002 |
| JP | 2002242246 A | 8/2002 |
| JP | 2002266393 A | 9/2002 |
| JP | 2002266394 A | 9/2002 |
| JP | 2002294775 A | 10/2002 |
| JP | 2002364035 A | 12/2002 |
| JP | 2003027537 A | 1/2003 |
| JP | 2003027543 A | 1/2003 |
| JP | 2003056027 A | 2/2003 |
| JP | 2003064743 A | 3/2003 |
| JP | 2003119854 A | 4/2003 |
| JP | 2003147823 A | 5/2003 |
| JP | 2003171958 A | 6/2003 |
| JP | 2003213745 A | 7/2003 |
| JP | 2003232059 A | 8/2003 |
| JP | 2003293405 A | 10/2003 |
| JP | 2003293406 A | 10/2003 |
| JP | 2004116083 A | 4/2004 |
| WO | WO9112896 A1 | 9/1991 |
| WO | WO1995029300 A1 | 11/1995 |
| WO | WO2000032314 A1 | 6/2000 |

(56) References Cited

FOREIGN PATENT DOCUMENTS

| WO | WO2001034917 A1 | 5/2001 |
| WO | WO2001077577 A1 | 10/2001 |
| WO | WO02061330 A2 | 8/2002 |
| WO | WO 2009/158498 | 12/2009 |
| WO | WO2010120070 A2 | 10/2010 |
| WO | WO2010120070 A3 | 1/2011 |

* cited by examiner

ILLUMINATION DEVICE FOR A FLUID DELIVERY APPARATUS

CROSS-REFERENCE TO RELATED APPLICATION

This application claims priority to U.S. Provisional Patent Application, Ser. No. 62/490,008, filed Apr. 25, 2017, the disclosure of which is expressly incorporated herein by reference.

BACKGROUND AND SUMMARY OF THE DISCLOSURE

The present invention relates to fluid delivery devices and, more particularly, to an illumination device for a sprayhead.

Illumination devices associated with fluid delivery devices are known. Such illumination devices may include indicator lights for providing a visual indication of a status or a condition of fluid delivery device and/or water flowing from the fluid delivery device, and nightlights associated with lavatory faucets. Such illumination devices typically include a single light source, or a plurality of light sources providing for discrete areas of illumination (i.e. "hot spots").

The present disclosure provides for an illumination device associated with a sprayhead that provides a light pipe illuminated by at least one light emitter. Illustratively, the sprayhead may comprise a pull-down sprayhead configured to be releasably coupled to a delivery spout of a faucet, or a pendant showerhead configured to be suspended downwardly from a ceiling in a shower stall.

According to an illustrative embodiment of the present disclosure, a sprayhead includes a housing defining a longitudinal axis, a waterway received within the housing, a sprayface fluidly coupled to the waterway and supporting a water outlet, and an illumination device supported by the housing. The illumination device includes a substrate, a plurality of light emitters supported by the substrate, and a translucent light pipe defining a closed loop to diffuse light from the light emitters outwardly away from the housing. A hydro-generator may be in fluid communication with the waterway to provide electricity to the illumination device.

According to a further illustrative embodiment of the present disclosure, a pull-down sprayhead for a faucet includes a housing defining a longitudinal axis extending between a proximal end and a distal end, a waterway received within the housing, a sprayface fluidly coupled to the waterway and defining a water outlet, and an illumination device supported by the housing. The illumination device includes a substrate, a plurality of light emitters supported by the substrate, and a translucent light pipe including an outer illumination surface extending perpendicular to the longitudinal axis of the housing. The translucent light pipe defines a closed loop to diffuse light outwardly from the light emitters outwardly to the outer illumination surface.

According to another illustrative embodiment of the present disclosure, a pendant showerhead includes a housing defining a longitudinal axis, a waterway received within the housing, a sprayface fluidly coupled to the waterway and including a water outlet, and an illumination device supported by the sprayface. The illumination device includes a substrate, a plurality of light emitters supported by the substrate, and a translucent light pipe defining a closed loop surrounding the water outlet to diffuse light from the light emitters outwardly in a direction parallel to the longitudinal axis.

Additional features and advantages of the present invention will become apparent to those skilled in the art upon consideration of the following detailed description of the illustrative embodiment exemplifying the best mode of carrying out the invention as presently perceived.

BRIEF DESCRIPTION OF DRAWINGS

The detailed description of the drawings particularly refers to the accompanying figures, in which.

DETAILED DESCRIPTION OF THE DRAWINGS

Figure 1:
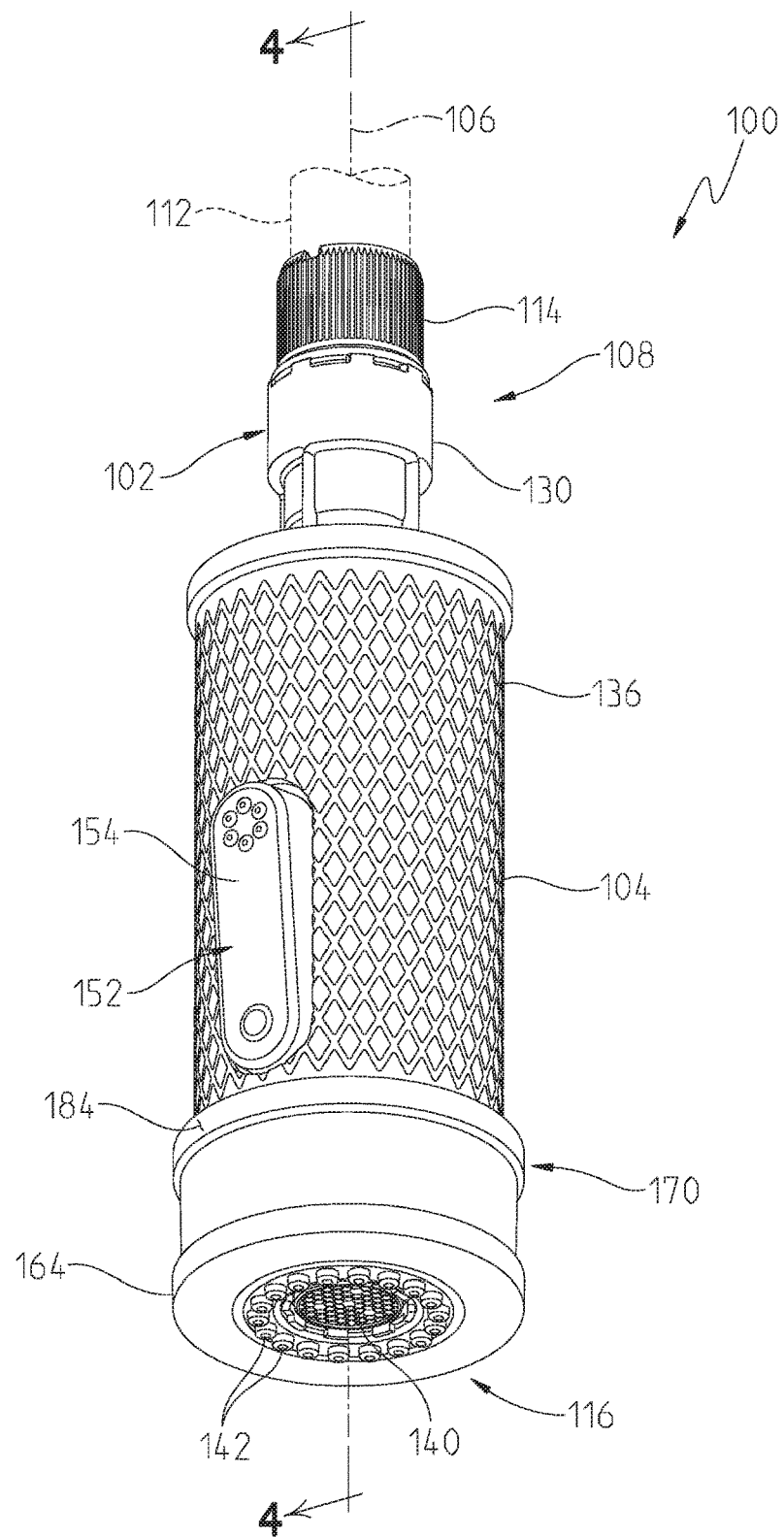
FIG. 1 is a perspective view of an illustrative sprayhead including an illumination device of the present disclosure.

For the purposes of promoting an understanding of the principles of the present disclosure, reference will now be made to the embodiments illustrated in the drawings, which are described herein. The embodiments disclosed herein are not intended to be exhaustive or to limit the invention to the precise form disclosed. Rather, the embodiments are chosen and described so that others skilled in the art may utilize their teachings. Therefore, no limitation of the scope of the claimed invention is thereby intended. The present invention includes any alterations and further modifications of the illustrated devices and described methods and further applications of the principles of the invention which would normally occur to one skilled in the art to which the invention relates.

Figure 2:
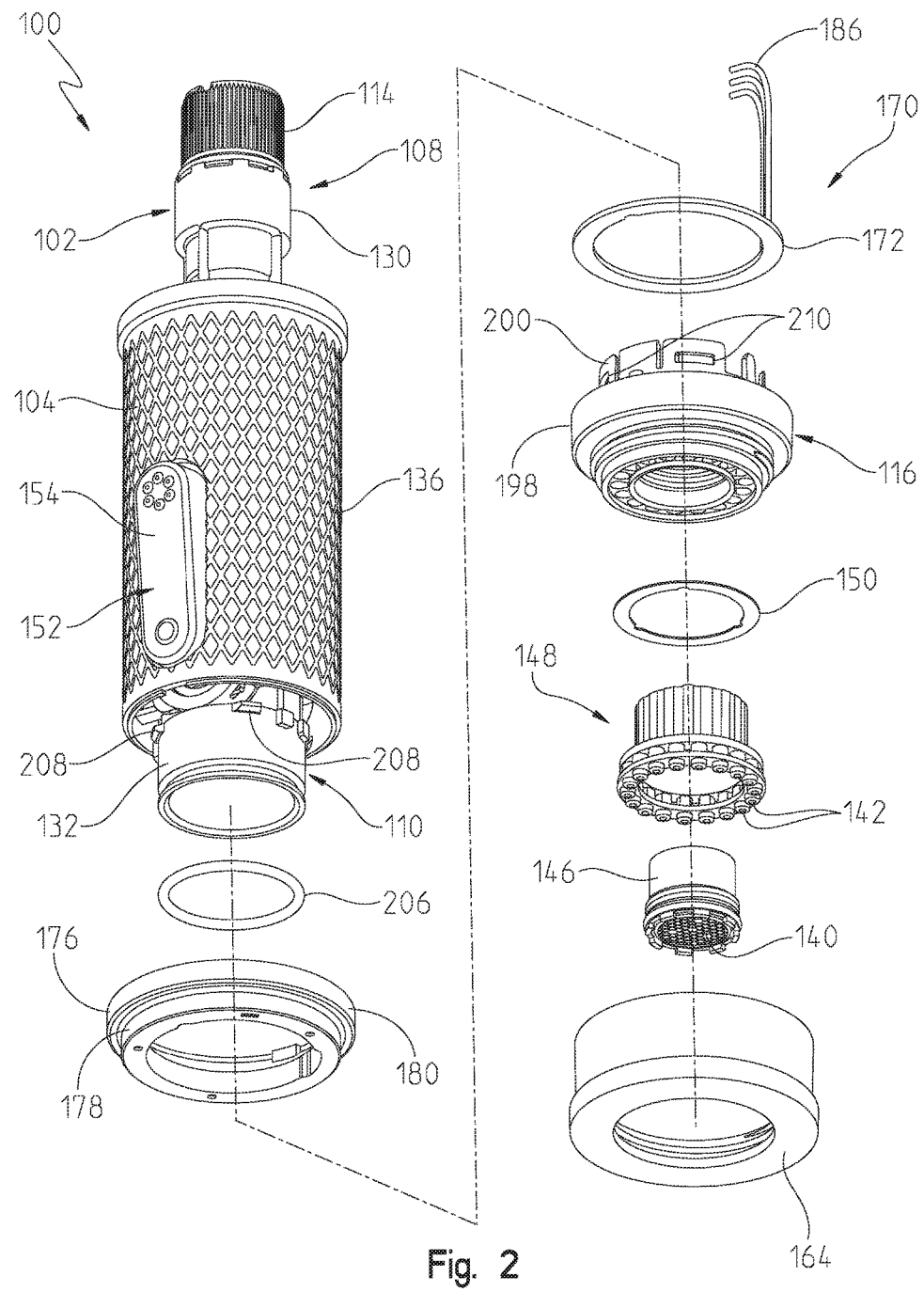
FIG. 2 is an top exploded perspective view of the illustrative sprayhead of FIG. 1.
Figure 3:
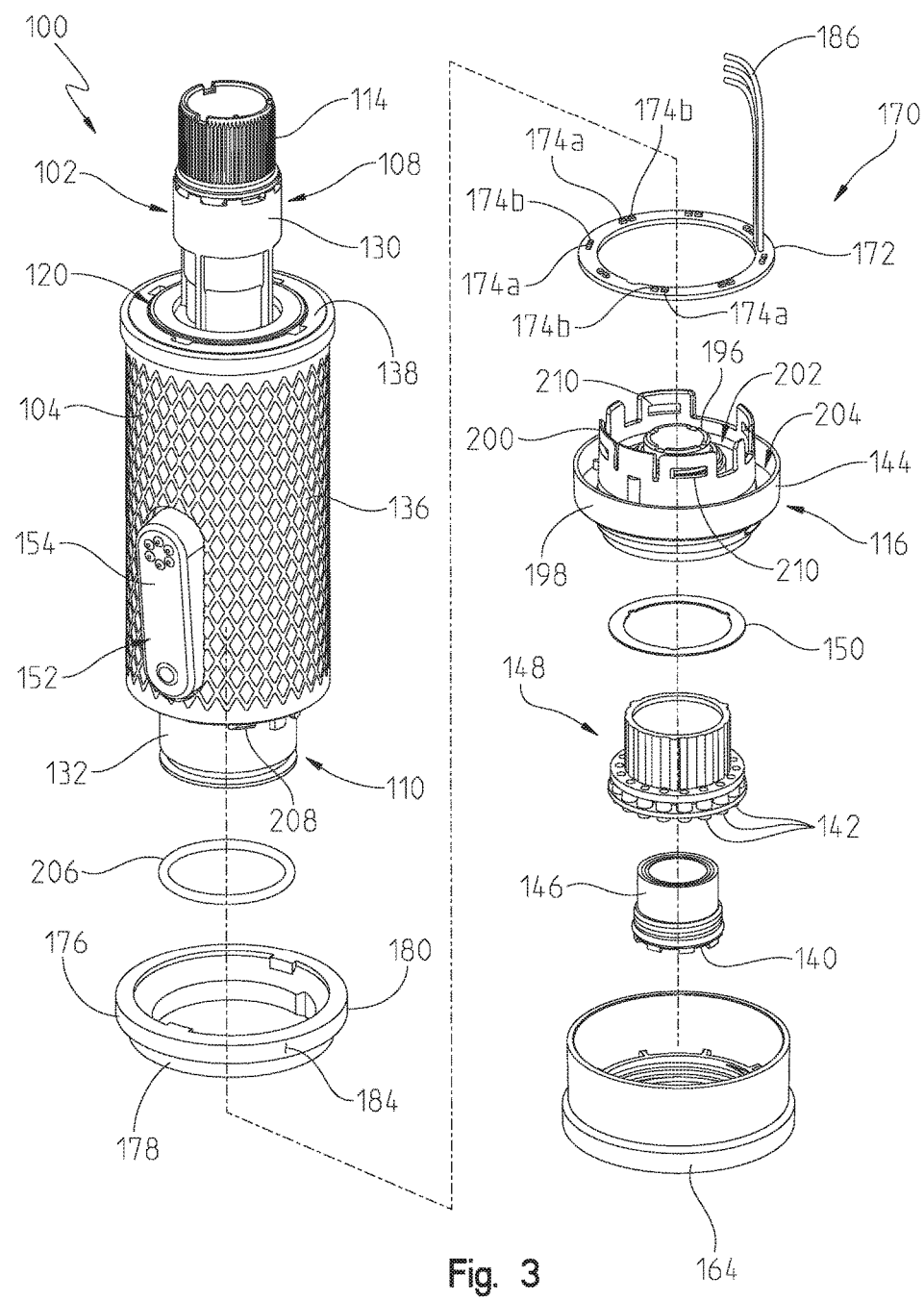
FIG. 3 is a bottom exploded perspective view of the illustrative sprayhead of FIG. 1.

Referring initially to FIGS. 1-2, an illustrative embodiment fluid delivery device is shown in the form of a pull-down sprayhead or faucet wand 100. The illustrative sprayhead 100 includes a waterway 102 received within an outer shell or housing 104, and extending along a longitudinal axis 106 between an inlet or proximal end 108 and an outlet or distal end 110. A hose 112 is fluidly coupled to the inlet end 108 of the waterway 102 by a conventional fluid connector 114, and a sprayface 116 is fluidly coupled to the outlet end 110 of the waterway 102.

Figure 4:
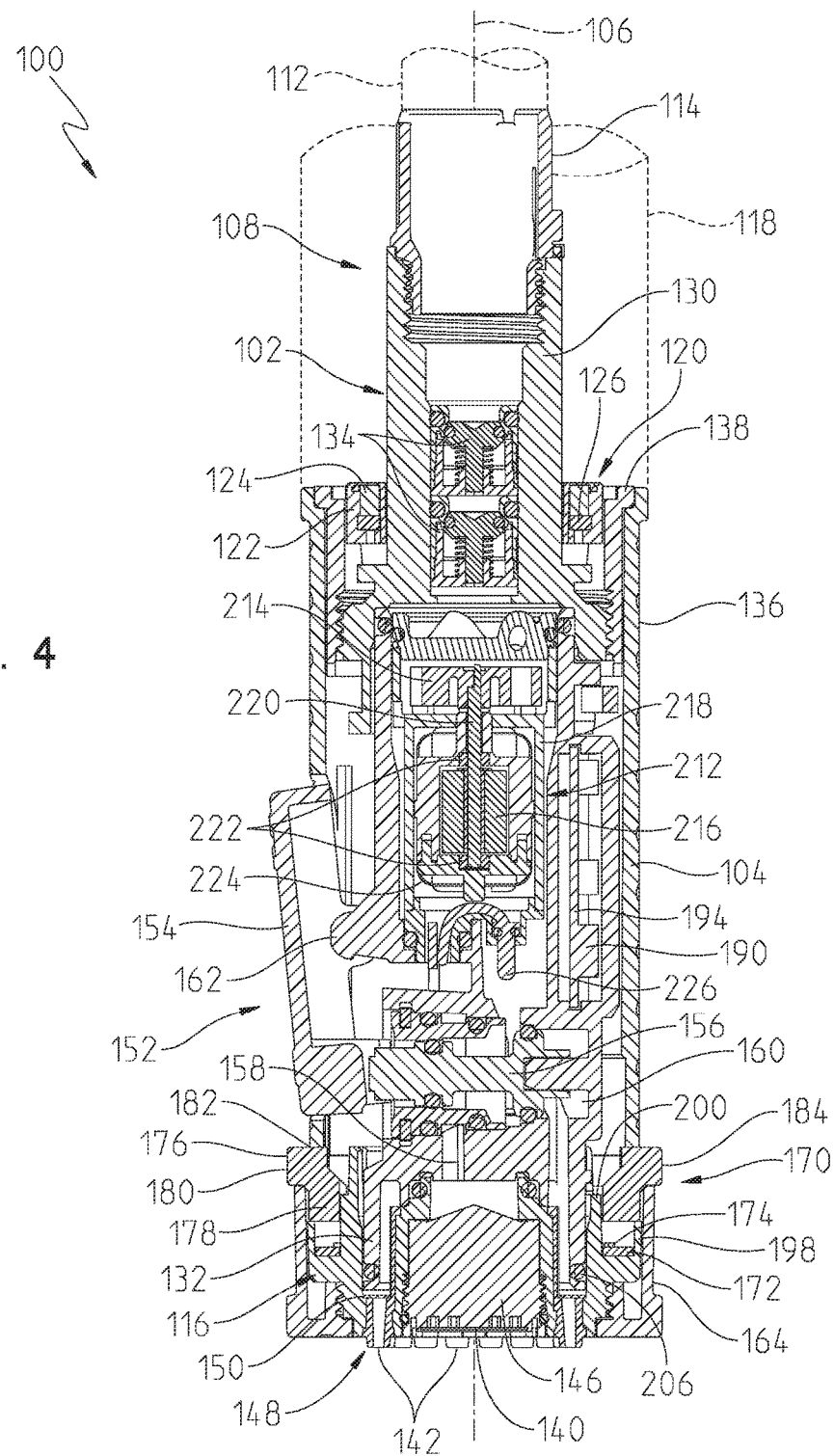
FIG. 4 is a cross-sectional view taken along line 4-4 of FIG. 1.
Figure 5:
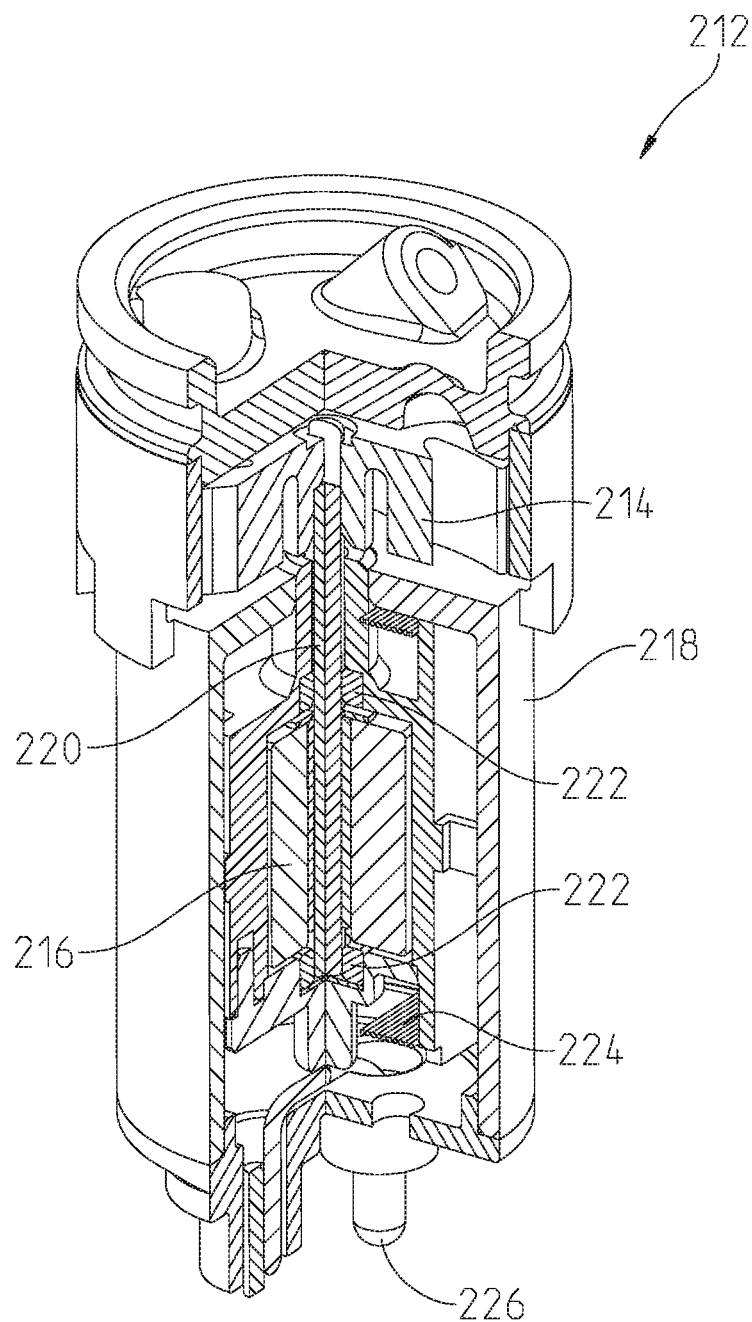
FIG. 5 is a perspective view, in partial cross-section, of the hydro-generator of the illustrative sprayhead of FIG. 1.

The hose 112 is illustratively formed of a flexible polymer (e.g., cross-linked polyethylene (PEX)) for being slidably received within a delivery spout 118 of a faucet (FIG. 4). More particularly, the faucet wand 100 may be removably coupled to an outlet of the delivery spout 118 in a conventional manner. The sprayhead 100 illustratively includes a coupler 120 for releasably coupling the sprayhead 100 to the outlet of the delivery spout 118. The coupler 120 illustratively includes a housing 122 overmolded around a magnet 124 and a backing plate 126. As is known, the magnet 124 is configured to releasably couple with a magnetically attractive material (not shown) supported by the delivery spout 118.

The waterway 102 illustratively includes an upper or proximal portion 130 defining the inlet end 108, and a lower or distal portion 132 defining the outlet end 110. Both proximal and distal portions 130 and 132 of the waterway 102 may be formed of a polymer, such as polyamide. Check valves 134 may be received within the proximal portion 130 of the waterway 102 to prevent the backflow of water from the sprayhead 100 into the hose 112 (FIG. 4).

The housing 104 illustratively includes a cylindrical outer housing wall 136 receiving the waterway 102 and coaxially aligned with the longitudinal axis 106. Illustratively, the housing 104 may be formed of a metal or a metal plated polymer, such as acrylonitrile butadiene styrene (ABS). A nut 138 may threadably engage with a distal end of the proximal portion 130 of the waterway 102 to secure the waterway 102 from moving axially in a distal direction within the housing 104.

The sprayface 116 illustratively includes a stream outlet 140 and a spray outlet 142. More particularly, the sprayface 116 includes a body 144 supporting a conventional aerator 146 defining the stream outlet 140, and a nozzle assembly 148 defining the spray outlet 142. An annular filter or screen is illustratively supported by the sprayface 116 upstream from the nozzle assembly 148.

A diverter valve assembly 152 may be fluidly coupled to the waterway 102 to illustratively alternate fluid communication between the inlet end 108 of the waterway 102 and the stream outlet 140 (e.g., aerator 146) and the spray outlet 142 (i.e., nozzle assembly 148). (FIG. 4) A user interface, illustratively a rocker arm 154, is configured to move a piston 156 and thereby toggle flow between a first passageway 158 in fluid connection with the stream outlet 140 and a second passageway 160 in fluid connection with the spray outlet 142. More particularly, the rocker arm 154 is configured to pivot about a protrusion 162 in response to user input which, in turn, causes axial movement of the piston 156.

A cap 164 may threadably engage with a distal end of the sprayface body 144 to secure the waterway 102 and the sprayface body 144 from moving axially in a proximal direction within the housing 104. As such, the nut 138 and the cap 164 cooperate with the outer wall 136 of the housing 104 to secure the waterway 102, the sprayface 116 and associated components relative to the housing 104.

A light assembly or illumination device 170 is supported by the housing 104 and is configured to direct light radially outwardly relative to the longitudinal axis 106. The illumination device 170 illustratively includes a substrate 172 supporting a plurality of light emitters 174. A translucent light pipe or diffuser 176 defines a closed loop to diffuse light outwardly from the light emitters 174.

The light pipe 176 is illustratively formed of a translucent material (e.g., a polymer or acrylic) and extends laterally outwardly from the outer wall 136 of the housing 104. More particularly, the light pipe 176 is positioned longitudinally intermediate the outer wall 136 of the housing 104 and the cap 164. Illustratively, the light pipe 176 includes an annular ring configured to transmit light radially outwardly. The annular ring illustratively includes an annular distal portion 178 and an annular proximal portion 180. The distal portion 178 extends parallel to the longitudinal axis 106 and is configured to transmit light from the light emitters 174 in an axial direction. The proximal portion 180 extends radially outwardly from the distal portion 178 within a gap or opening 182 between the housing 104 and the cap 164 for transmitting light radially toward an outer illumination surface 184. The outer illumination surface 184 defines a closed loop and is positioned radially outside of the outer wall 136 of the housing 104.

Figure 6:
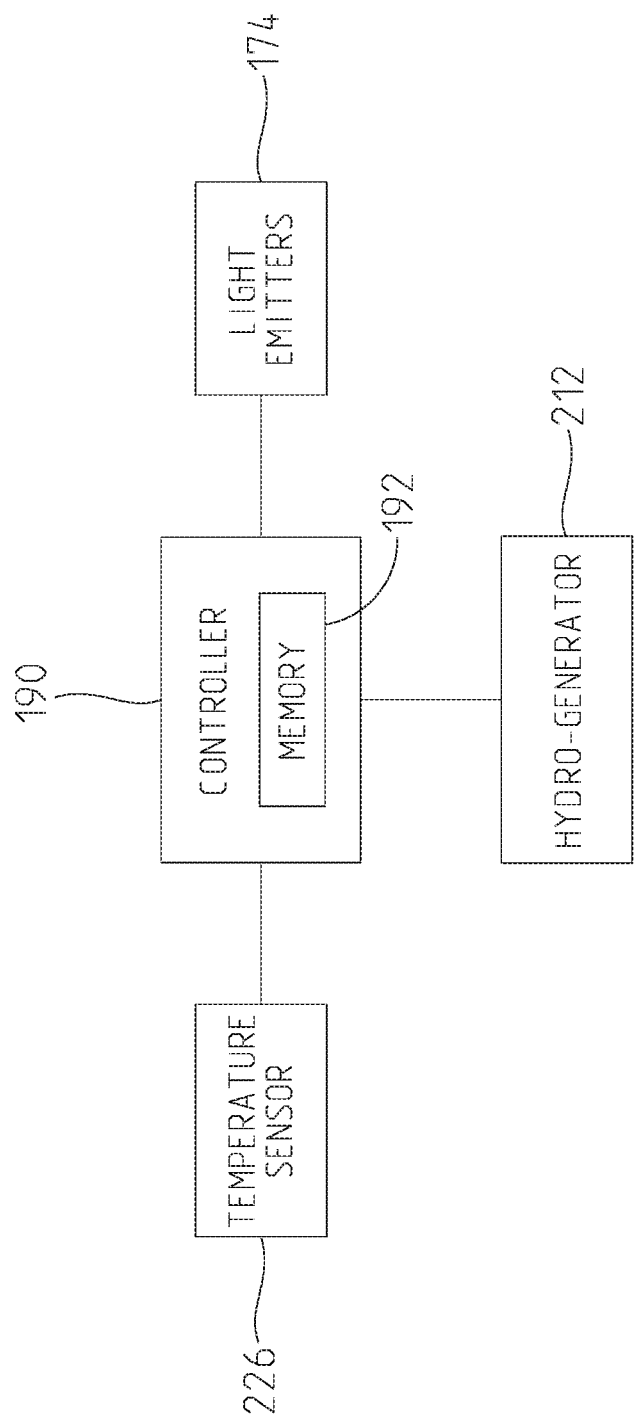
FIG. 6 is a block diagram of various components of the illustrative sprayhead of FIG. 1.

The light emitters 174 illustratively comprise a plurality of light emitting diodes (LEDs) circumferentially spaced on the substrate 172. Illustratively, the substrate 172 comprises a printed circuit board (e.g., a glass reinforced epoxy laminate sheet) including a plurality of electrically conductive traces (e.g., formed of copper) supported thereon for coupling the LEDs to wires 186. The wires 186 may be in electrical communication with a controller 190 including a memory 192 supported on a printed circuit board 194 (FIGS. 4 and 6).

The body 144 of the sprayface 116 illustratively includes concentric inner, outer and intermediate walls 196, 198, 200. An inner annular space 202 is defined intermediate the inner wall 196 and the intermediate wall 200, and an outer annular space 204 is defined intermediate the outer wall 198 and the intermediate wall 200. The distal end of the distal portion 132 of the waterway 102 is illustratively received within the inner annular space 202. An o-ring 206 provides a seal between the waterway 102 and the intermediate wall 200 of the sprayface 116. Tabs 208 on the distal portion 132 of the waterway 102 are received in openings 210 in the intermediate wall 200 of the sprayface 116 couple the sprayface 116 to the waterway 102.

The substrate 172 of the illumination device 170 is received within the outer annular space 204 of the sprayface body 144, with the light emitters 174 facing a proximal direction. The distal portion 178 of the light pipe 176 is likewise received within the outer annular space 204 in distal spaced relation to the light emitters 174.

A power source is in electrical communication with the light emitters 174. Illustratively, the power source includes a hydro-generator 212 fluidly coupled to the waterway 102. More particularly, an impeller 214 of the hydro-generator 212 is positioned within the water flow path defined by the distal portion 132 of the waterway 102. Magnets 216 are received within a housing 218 and coupled to the impeller 214 via a shaft 220 rotatably supported by bearings 222. As such, rotation of the impeller 214 by water flow through the waterway 102 causes similar rotation of the magnets 216. Coils 224 are supported within the housing 218 and proximate the magnets 216. As is known, rotation of the magnets 216 relative to the coils 224 generates electricity which is then provided to the light emitters 174.

A temperature sensor 226 is provided within the flow passageway of the distal portion 132 of the waterway 102. Illustratively, the temperature sensor 226 may comprise a negative temperature coefficient (NTC) thermistor in electrical communication with the controller 190.

The light emitting diodes 174 may each be configured to emit visible light of the same color (e.g., white LEDs), or may be configured to emit visible light of different colors (blue/red bi-color LEDs). Alternatively, different light emitting diodes 174 may be configured to emit different colors (e.g., alternating blue and red LEDs). In the illustrative embodiment, sixteen (16) different LEDs 174 are supported on the substrate in eight circumferentially spaced groups of two LEDs 174a, 174b. Illustratively, the first LEDs 174a are blue color LEDS, and the second LEDs 174b are red color LEDs. As may be appreciated, the separate blue and red color LEDs 174a, 174b may be replaced red/blue bi-color LEDs. Additionally, the number and relative positioning of the LEDs 174 may vary.

In operation of an illustrative embodiment, light emitters 174a generate light of a first color (e.g., blue) when the signal from the temperature sensor 226 detects a first water temperature, and light emitters 174b generate light of a second color (e.g., red) when the signal from the temperature sensor 226 detects a second water temperature greater than the first water temperature. Illustratively, the first and second light emitters 174a, 174b blend the light of the first color and the light of the second color and generate light of a third color when the signal from the temperature sensor 226 detects a third water temperature between the first water temperature and the second water temperature.

Illustratively, when water flows through the faucet sprayhead 100, the hydro-generator 212 creates power required for electrical components, including the temperature sensor 226 to detect the water temperature dispensed from the sprayface 116, and to display corresponding colored light from the light emitters 174.

Figure 7:
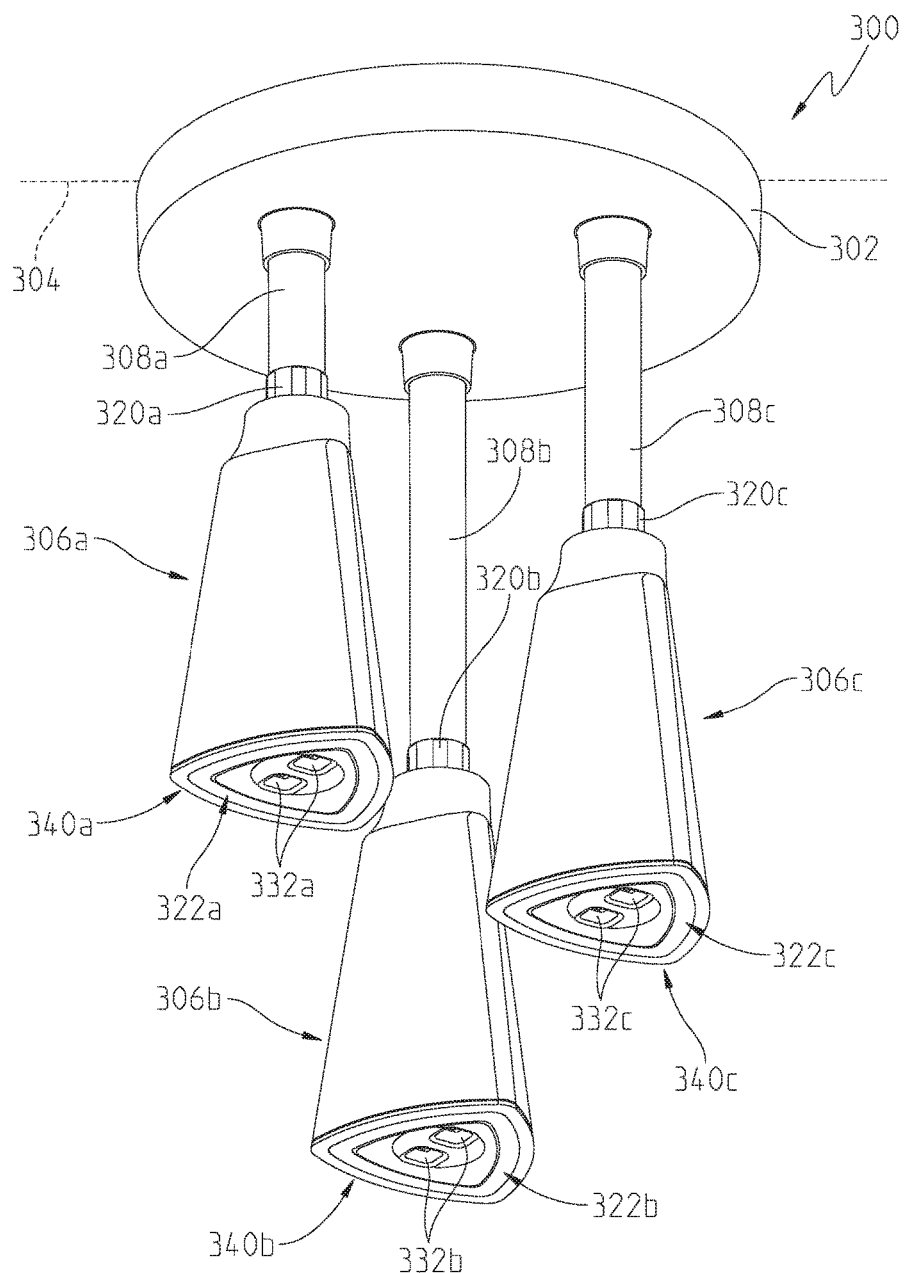
FIG. 7 is a perspective view of an illustrative pendant showerhead assembly of the present disclosure.
Figure 8:
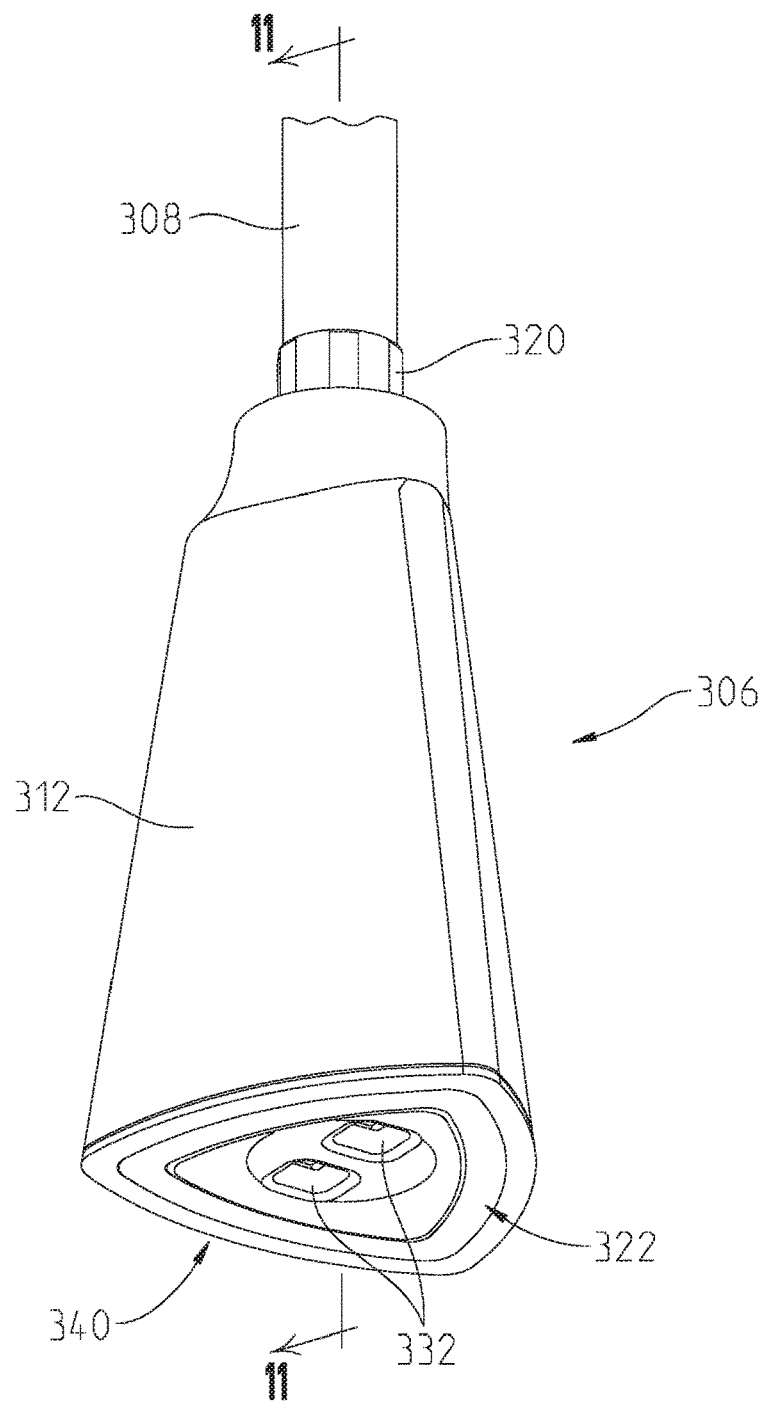
FIG. 8 is a perspective view of an illustrative pendant showerhead of FIG. 7.
Figure 9:
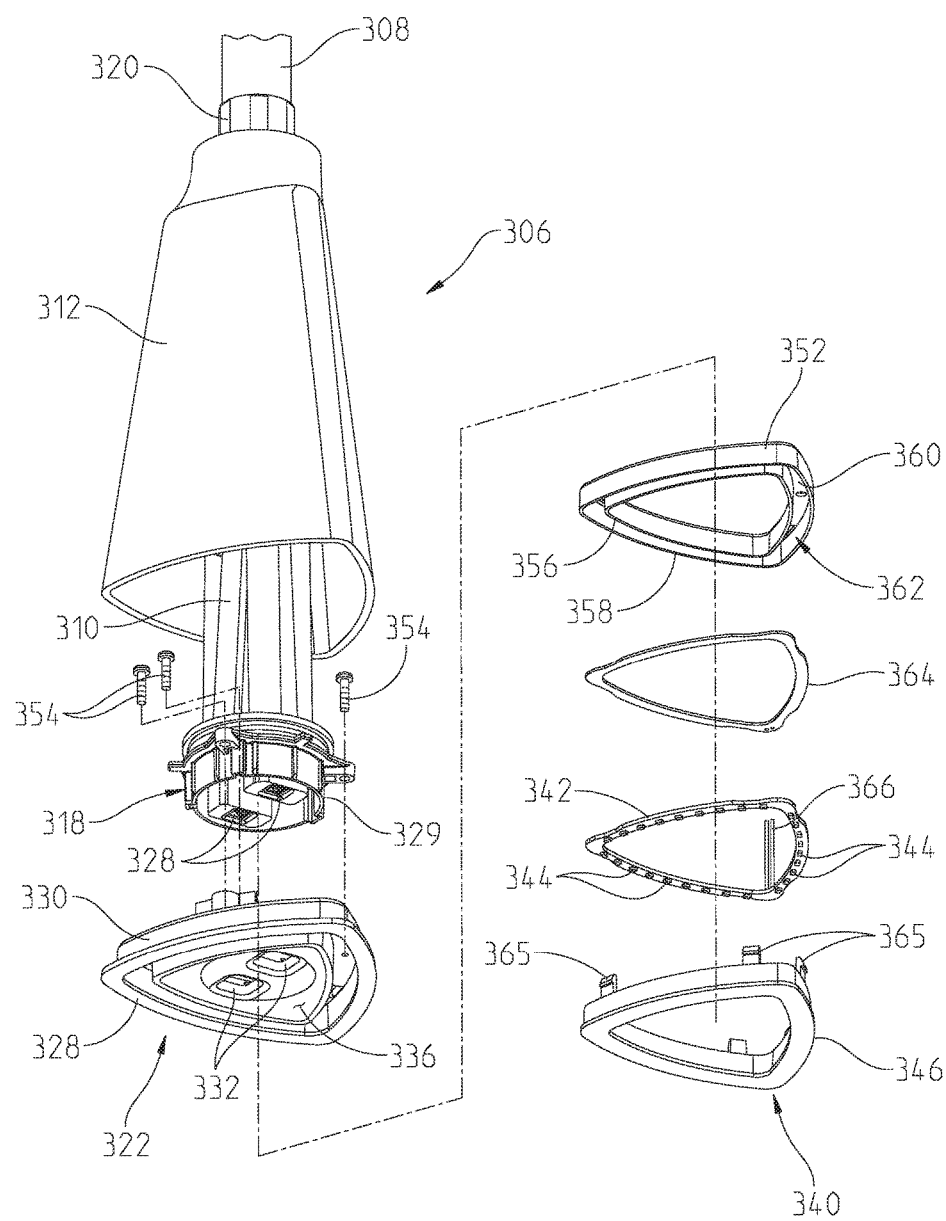
FIG. 9 is a bottom exploded perspective view of the illustrative pendant showerhead of FIG. 8.
Figure 10:
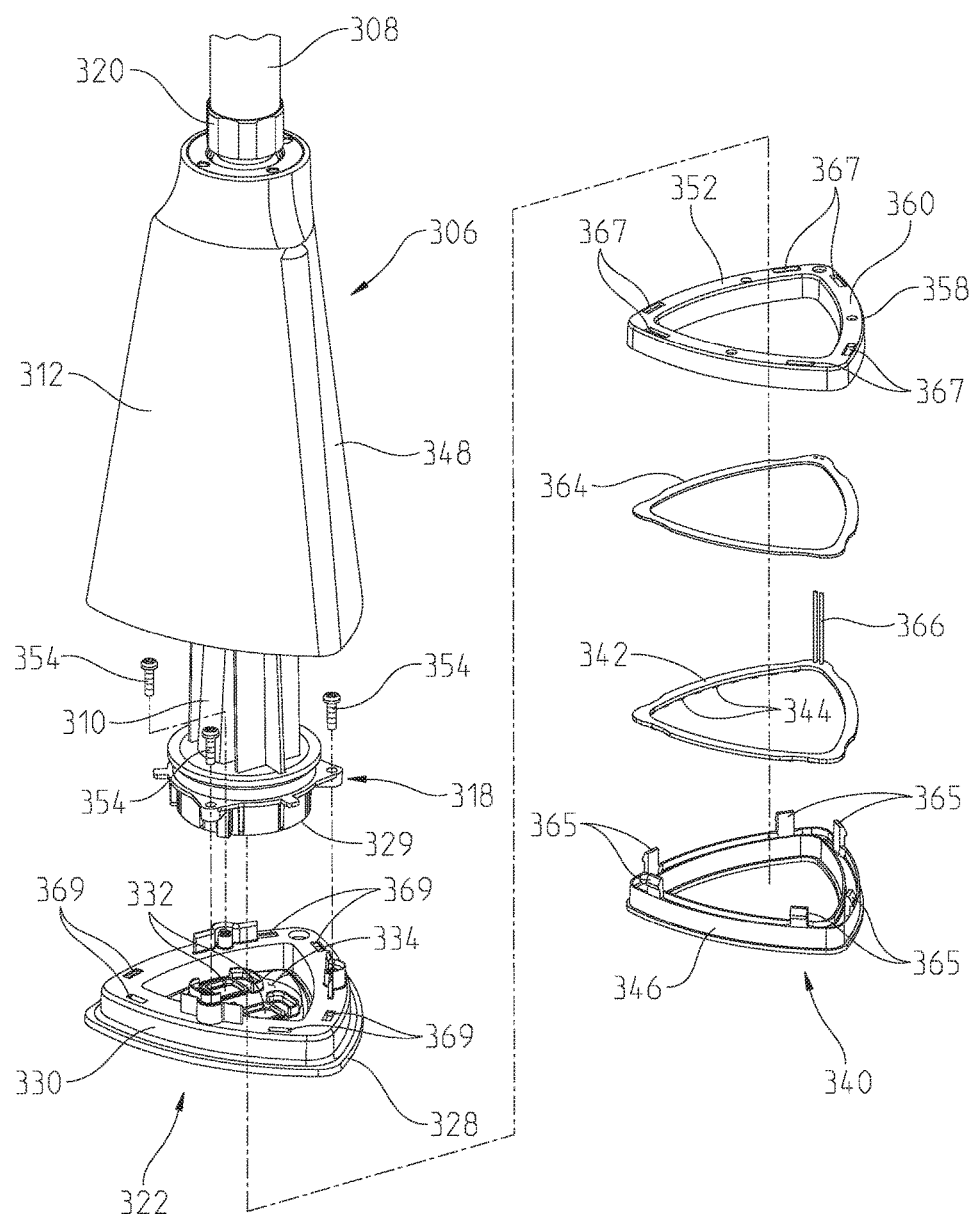
FIG. 10 is a top exploded perspective view of the illustrative pendant showerhead of FIG. 8.

In a further illustrative embodiment of the present disclosure as shown in FIGS. 7 and 8, a pendent showerhead assembly 300 includes a base 302 configured to be fixed to a ceiling 304 of a shower stall and supporting a plurality pendent showerheads 306. While three pendent showerheads 306a, 306b, 306c are shown in FIG. 7, any number of showerheads 306 may be supported by the base 302 (i.e., at least one). Illustratively, a support tube or arm 308 fluidly couples each pendent showerhead 306 to a fluid supply (illustratively a flow control valve) and suspends the showerhead 306 from the base 302.

Figure 11:
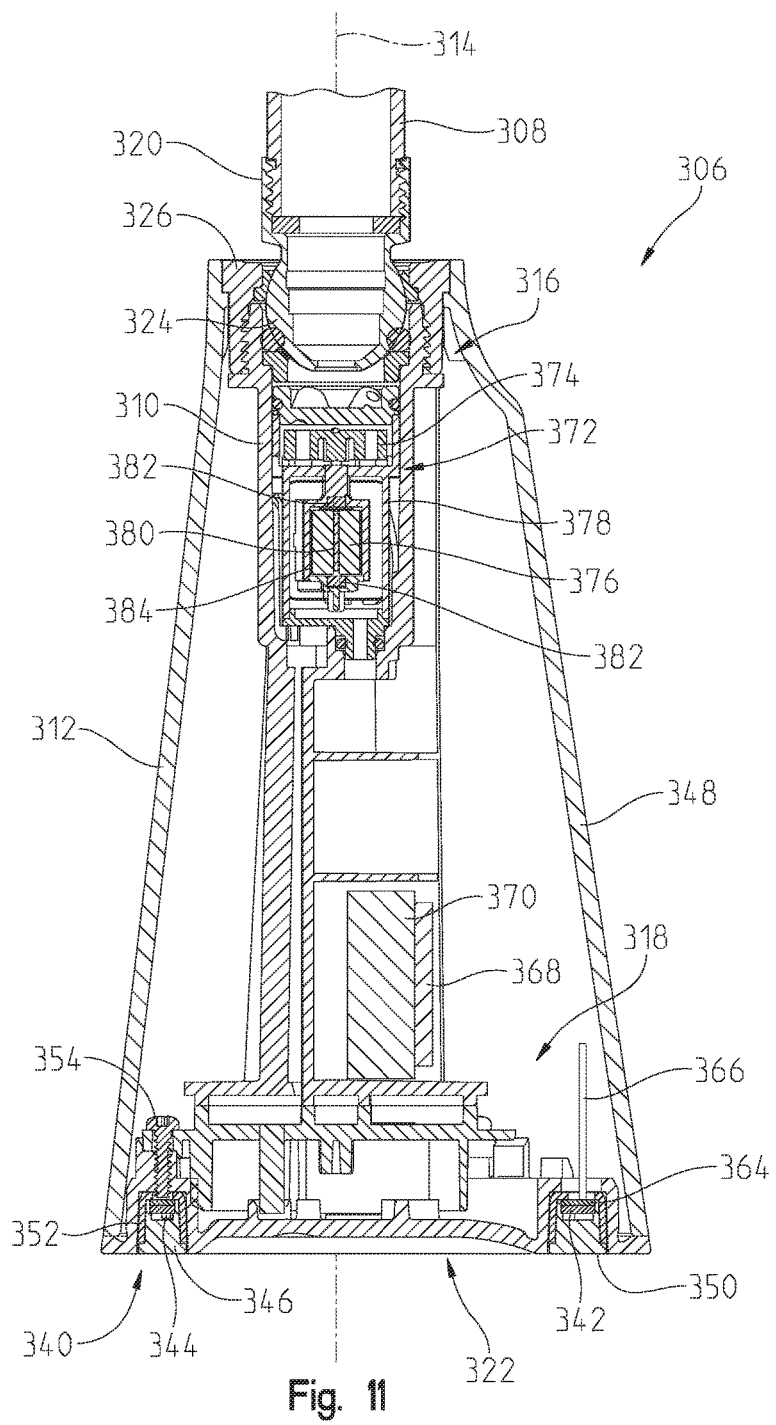
FIG. 11 is a cross-sectional view taken along line 11-11 of FIG. 8.

Each showerhead 306 within the assembly 300 is substantially identical. With reference to FIGS. 8-11, an illustrative showerhead 306 includes a waterway 310 received within an outer housing or shell 312, and extending along a longitudinal axis 314 between an inlet or proximal end 316 and an outlet or distal end 318. The support arm 308 is fluidly coupled to the inlet end of the waterway 310 by a conventional fluid connector 320, and a sprayface 322 is fluidly coupled to the outlet end 318 of the waterway 310. The fluid connector 320 illustratively includes a ball joint 324 to permit adjustment of the showerhead 306 about at least two orthogonal axes (FIG. 11). A nut 326 threadably engages with the proximal end 316 of the waterway 310 to fluidly couple the support tube 308 with the waterway 310.

The sprayface 322 illustratively includes a base 328 with an upwardly extending sidewall 330. Water outlet openings 332 are formed within the base 328 of the sprayface 322 and extend between an upper surface 334 and a lower surface 336.

Fluid devices, such as nozzles, are illustratively received within the outlet openings 332. In an illustrative embodiment, a pair of multi-dimensional fluid dispensers or fluidic devices 328 are supported by a receiving body 329 of the outlet end 318 of the waterway 310 and are in fluid communication with the support tube 308. As further detailed herein, a multi-dimensional fluidic device 328 is configured to produce a stream or jet of water moving in at least two dimensions. Additional details of illustrative fluidic devices are provided in US Patent Application Publication No. 2013/0299608 to Spangler et al., the disclosure of which is expressly incorporated herein by reference.

A light assembly or illumination device 340 is supported by the sprayface 322 and is configured to direct light outwardly in a direction parallel to the longitudinal axis 314.

The illumination device 340 illustratively includes a substrate 342 supporting a plurality of light emitters 344. A translucent light pipe or diffuser 346 is coupled to the substrate 342 and defines a closed loop laterally surrounding the water outlet openings 332. More particularly, the housing 312 includes an outer housing wall 348, and the light pipe 346 is supported within the sprayface 322 laterally intermediate the water outlets 332 and the housing wall 348. The light pipe 346 is configured to transmit light outwardly in a direction parallel to the axis 314 of the showerhead 306 toward an outer illumination surface 350. The outer illumination surface 350 illustratively defines a closed loop positioned laterally outside of the water outlets 332 and flush with the adjacent outer surface 336 of the sprayface 322.

The illumination device 340 further illustratively includes an upper housing 352 coupled to the sprayface 322 and supporting the light emitters 344. More particularly, fasteners 354 illustratively couple the upper housing 352 and the sprayface 322 to the receiving body 329 of the waterway 310. The upper housing 352 includes inner and outer walls 356 and 358 extending downwardly from a base 360. A cavity or recess 362 is defined between the walls 356 and 358 and receives the substrate 342. An adhesive gasket 364 may be used to secure the substrate 342 within the cavity 362 such that the light emitters 344 are supported on a lower surface of the substrate 342. In a further illustrative embodiment, a potting material (e.g., a transparent resin) may be used to secure the substrate 342 and the light emitters 344 within the cavity 362. Additionally, the potting material may enclose the substrate 342 and the light emitters 344 to provide a seal from humidity and water.

The light pipe 346 is illustratively coupled to the upper housing 352 by flexible tabs 365 extending upwardly from an upper surface of the light pipe 346, through openings or slots 367 formed within the upper housing 352, and received within openings or slots 369 formed within the sprayface 322. In alternative embodiments, the light pipe 346 may be held in place by being sandwiched between the nut 326, the shell 348, the waterway 310 and the faceplate 322. It may be appreciated that other coupling means may be substituted therefor.

The light emitters 344 illustratively comprise a plurality of light emitting diodes (LEDs) circumferentially spaced on the substrate 342. Illustratively, the substrate 342 comprises a printed circuit board (e.g., a glass reinforced epoxy laminate sheet) including a plurality of electrically conductive traces (e.g., formed of copper) supported thereon for coupling the LEDs to wires 366. The wires 366 may be in electrical communication with a controller 368 supported on a printed circuit board 370. A potting material (e.g., a transparent resin) may seal the controller 368 and the printed circuit board 370 from humidity and water.

A power source is in electrical communication with the light emitters 344. Illustratively, the power source includes a hydro-generator 372 fluidly coupled to the waterway 310. More particularly, an impeller 374 of the hydro-generator 372 is within the water flow path defined by the waterway 310. Magnets 376 are received within a housing 378 and coupled to the impeller 374 via a shaft 380 rotatable supported by bearings 382. As such, rotation of the impeller 374 by water flow through the waterway 310 causes similar rotation of the magnets 376. Coils 384 are supported within the housing 378 and proximate the magnets 376. As is known, rotation of the magnets 376 relative to the coils 384 generates electricity which is then provided to the light emitters 344.

Although the invention has been described in detail with reference to certain preferred embodiments, variations and modifications exist within the spirit and scope of the invention as described and defined in the following claims.

The invention claimed is:

1. A sprayhead comprising:
a housing defining a longitudinal axis;
a waterway received within the housing;
a sprayface fluidly coupled to the waterway and supporting a water outlet; and
an illumination device supported by the housing, the illumination device including a substrate, a plurality of light emitters supported by the substrate, and a translucent light pipe defining a closed loop to diffuse light from the light emitters outwardly away from the housing.

2. The sprayhead of claim 1, wherein the sprayhead comprises a pull-down sprayhead configured to be releasably coupled to a delivery spout of a faucet.

3. The sprayhead of claim 2, wherein the light pipe includes an annular ring configured to transmit light radially outwardly from the longitudinal axis.

4. The sprayhead of claim 3, wherein the light emitters comprise a plurality of circumferentially spaced light emitting diodes.

5. The sprayhead of claim 3, further comprising a diverter valve assembly fluidly coupled to the waterway, wherein the sprayface includes a stream outlet and a spray outlet, the diverter valve assembly configured to divert water between the stream outlet and the spray outlet.

6. The sprayhead of claim 1, wherein the sprayhead comprises a pendant showerhead configured to be suspended downwardly from a ceiling.

7. The sprayhead of claim 6, further comprising a pendant arm and a coupler fluidly coupling the waterway to the pendant arm, the coupler including a ball joint such that the housing is supported for rotation about at least two orthogonal axes.

8. The sprayhead of claim 6, wherein the housing includes an outer housing wall, and the light pipe is supported within the spray face laterally intermediate the water outlet and the housing wall.

9. The sprayhead of claim 1, further comprising a hydro-generator fluidly coupled to the waterway and in electrical communication with the illumination device.

10. A pull-down sprayhead for a faucet, the sprayhead comprising:
a housing defining a longitudinal axis extending between a proximal end and a distal end;
a waterway received within the housing;
a sprayface fluidly coupled to the waterway and defining a water outlet; and
an illumination device supported by the housing, the illumination device including a substrate, a plurality of light emitters supported by the substrate, and a translucent light pipe including an outer illumination surface extending perpendicular to the longitudinal axis of the housing, the translucent light pipe defining a closed loop to diffuse light from the light emitters outwardly to the outer illumination surface.

11. The sprayhead of claim 10, further comprising a hydro-generator fluidly coupled to the waterway and in electrical communication with the illumination device.

12. The sprayhead of claim 10, wherein the light pipe includes an annular ring configured to transmit light radially outwardly.

13. The sprayhead of claim 12, wherein the annular ring includes a distal portion extending parallel to the longitudinal axis and configured to transmit light from the light emitters in an axial direction, and a proximal portion extending radially outwardly from the distal portion and configured to transmit light toward the outer illumination surface.

14. The sprayhead of claim 12, wherein the light emitters comprise a plurality of circumferentially spaced light emitting diodes.

15. The sprayhead of claim 10, further comprising a diverter valve assembly fluidly coupled to the waterway, wherein the sprayface includes a stream outlet and a spray outlet, the diverter valve assembly configured to divert water between the stream outlet and the spray outlet.

16. The sprayhead of claim 10, further comprising a coupler configured to releasably couple the housing to a delivery spout of a faucet.

17. The sprayhead of claim 10, further comprising:
a temperature sensor configured to detect the temperature of water within the waterway; and
a controller in electrical communication with the temperature sensor, the controller configured to change the color of light emitted by the light emitters in response to the temperature detected by the temperature sensor.

18. The sprayhead of claim 17, wherein the plurality of light emitters include a first light emitter configured to generate light of a first color when the signal from the temperature sensor detects a first water temperature, a second light emitter configured to generate light of a second color when the signal from the temperature sensor detects a second water temperature greater than the first water temperature, and the first and second light emitters blend the light of the first color and the light of the second color and generate light of a third color when the signal from the temperature sensor detects a third water temperature between the first water temperature and the second water temperature.

19. A pendant showerhead comprising:
a housing defining a longitudinal axis;
a waterway received within the housing;
a sprayface fluidly coupled to the waterway and including a water outlet; and
an illumination device supported by the sprayface, the illumination device including a substrate, a plurality of light emitters supported by the substrate, and a translucent light pipe defining a closed loop surrounding the water outlet to diffuse light from the light emitters outwardly in a direction parallel to the longitudinal axis.

20. The showerhead of claim 19, further comprising a pendant arm and a coupler fluidly coupling the waterway to the pendant arm, the coupler including a ball joint such that the housing is supported for rotation about at least two orthogonal axes.

21. The showerhead of claim 19, further comprising a hydro-generator fluidly coupled to the waterway and in electrical communication with the illumination device.

22. The showerhead of claim 19, wherein the housing includes an outer housing wall, and the light pipe is supported within the spray face laterally intermediate the water outlet and the housing wall.

23. The showerhead of claim 22, wherein the translucent light pipe includes an outer illumination surface extending parallel to an outer surface of the sprayface.

24. The showerhead of claim 19, further comprising a multi-dimensional fluidic device received within the water outlet.

\* \* \* \* \*